United States Patent [19]
Lee

[11] Patent Number: 5,032,423
[45] Date of Patent: Jul. 16, 1991

[54] METHOD OF FORMING CONDUCTOR PATTERN ON DIELECTRIC

[75] Inventor: Seung-Woo Lee, Seoul, Rep. of Korea

[73] Assignee: Samsung Electron Devices Co., Ltd., Kyonggi-Do, Rep. of Korea

[21] Appl. No.: 409,109

[22] Filed: Sep. 19, 1989

[30] Foreign Application Priority Data

Mar. 21, 1989 [KR] Rep. of Korea ............... 89-3532

[51] Int. Cl.$^5$ .............................................. B05D 3/02
[52] U.S. Cl. ................................. 427/45.1; 427/47; 427/58; 427/128; 427/286
[58] Field of Search ............... 427/45.1, 47, 58, 256, 427/286

*Primary Examiner*—Bernard Pianalto
*Attorney, Agent, or Firm*—Lieberman, Rudolph & Nowak

[57] ABSTRACT

A method of forming a conductor pattern on a dielectric substrate and a firing furnace thereof are disclosed, the method comprising; a step of passing an electric current through coils wound on the outside of insulation wall of a firing furnace in order to produce an induction magnetic field; and a step of arranging the metal conductor components of the metal paste conductor printed on the dielectric substrate into a uniform state by means of the magnetic field, and the firing furnace comprising; coils wound on the outside of insulation wall of the firing furnace having a through passage; and a heat protection wall additionally installed. According to the present invention, the resistance value of the metal components of the conductor is reduced, with the result that the poser loss of a gas discharge display device due to a high resistance value can be prevented, and that the process can be reliably carried out.

1 Claim, 2 Drawing Sheets

FIG. 1
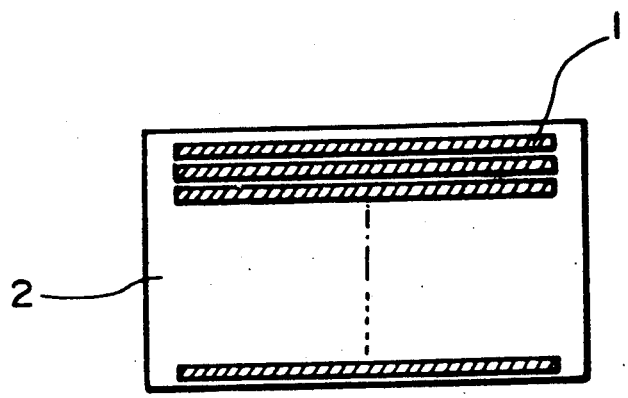
FIG. 2
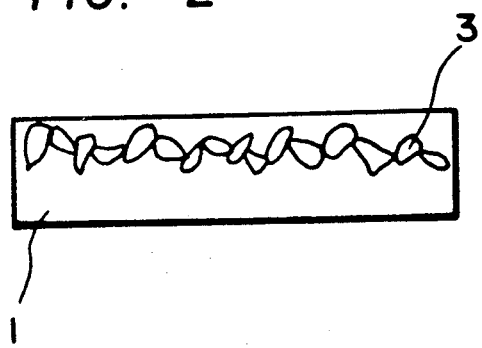
FIG. 3. A
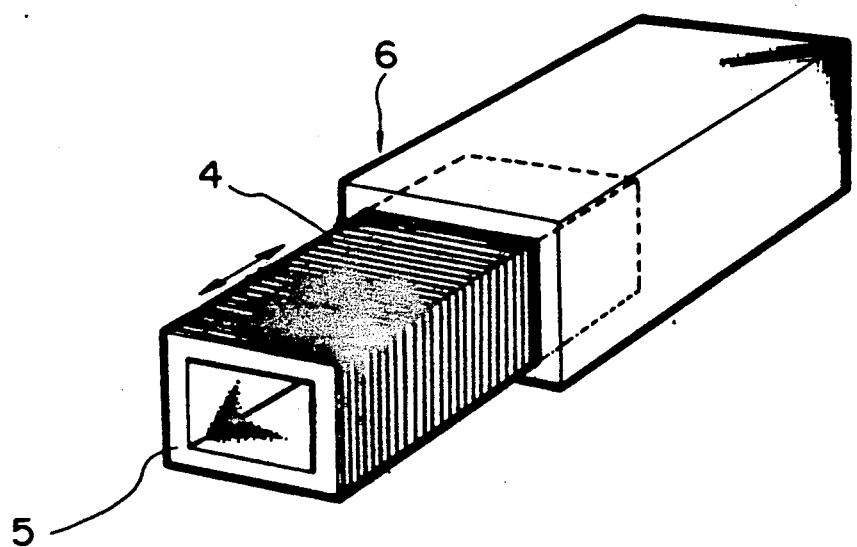

FIG. 3. B
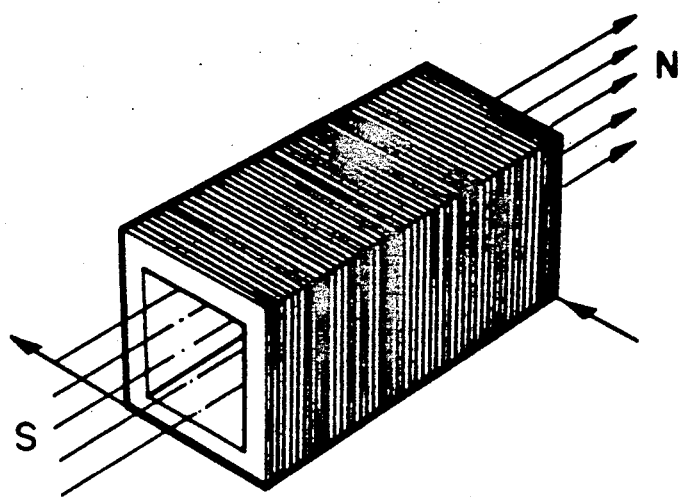
FIG. 4
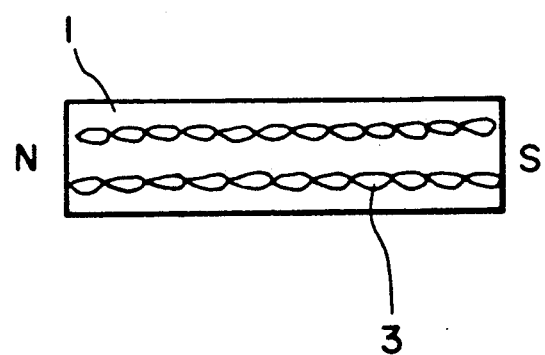

METHOD OF FORMING CONDUCTOR PATTERN ON DIELECTRIC

FEILD OF THE INVENTION

The present invention relates to a method of forming a conductor pattern on a dielectric, and a firing furnace therefor, and particularly to a method of forming a conductor pattern having a markedly reduced resistance value of a conductance by passing the metal conductor through a firing furnace after winding inductance coils on the outside insulation wall of the firing furnace in order to uniformly arrange the metal conductor forming electrode on a dielectric (for example, glass) substrate.

BACKGROUND OF THE INVENTION

Generally, as shown in FIG. 1, gas discharge display devices have a symmetric structure with electrodes on a dielectric substrate 2. The electrodes are constituted such that the metal conduotors 1 made of nickle paste and the like and are arranged in the form of stripes on a dielectric substrate.

The electrodes significantly influence the display device depending upon their resistance values because the power source gives rise to a voltage drop to the line connected to the electrode, and second electron productability, etc.

That is, if the resistance values of the electrodes are large, a voltage drop will occur on the line connected to the electrodes, thereby lowering the uniformity and the luminance of the gas (electric) discharge device.

In the conventional conductor pattern forming method, a thick film firing furnace is used to bake the conductors onto a dielectric substrate to form electrodes. Therefore, the component arrangement of the metal conductors becomes non-uniform in terms of probability as shown in FIG. 2.

Thus, if the conduction components 3 of the metal conductor are arranged in a non-uniform manner, the resistance value is increased, and the gas discharge display device made of a dielectric substrate causes an increase of power, consumption, non-uniform luminescence of the device, and a decrease of its own charactreistics.

In order to overcome such disadvantages, there has been proposed a method of adjusting the composition ratio of the metal conductor made of printing paste such nickle paste. Unfortunately, this technique uses also a probability arrangement method, thereby making it difficult to reduce the resistance values.

Japanese Patent Publication No. 1080/1981 teaches that the corrosion of the discharge surface of the discharge device electrode structure is reduced to extend life expectancy of the electrode structure but the use of this method is limited to discharge devices such as plasma electron or electric arc furnace.

In the cause of Swedish Patent No. 354766, coils are installed to establish a magnetic field, and spots are transferred along the inside of the electrodes, thereby forming only a plasma electron electrode in which the corrosion of the electrodes is prevented.

Therefore, there exists a long felt need for a method and a device capable of lowering the resistance values of the conductors printed on a dielectric substrate.

SUMMARY OF THE INVENTION

The present invention is intended to overcome the disadvantages of the conventional methods and devices.

Therefore, it is an object of the present invention to provide a method of forming a conductor pattern on a dielectric in which the reliability of the probability arrangement during the formation of the metal conductor pattern is improved.

It is another object of the present invention to provide a firing furnace for forming a conductor pattern on a dielectric.

In achieving the above objects, the present invention is constituted such that the metal conduction components of the conductor printer on a dielectric substrate are forcibly arranged by means of an induction magnetic field produced by winding coils along the inside wall of the firing furnace and by passing electric currents through the coils, the whole inside surface of the firing furnace being covered with coils, and an additional heat protecting wall being installed.

BRIEF DESCRIPTION OF THE DRAWINGS

The above objects and other advantages of the present invention will become more apparent by describing in detail the preferred embodiment of the present invention with reference to the attached drawings in which:

FIG. 1 is an examplary schematical view of a conductor pattern formed on a dielectric;

FIG. 2 illustrates the arrangement of the metal conduction domains in the conductor pattern formed on a dielectric according the conventional ways.

FIG. 3A is a schematical view of the firing furnace according to the present invention, and FIG. 3B shows the magnetic fields produced by the electric current flowing through the coils installed on the ourside of insulation wall of the firing furnace; and FIG. 4 illustrates the arrangement of the conductor domains formed according to the method of the present invention.

DESCRIPTION OF THE PREFERRED EMBODIMENT

FIG. 3 illustrates a firing furnace showing the method of the formation of a conductor pattern according to the present invention. FIG. 3A is a schematical view of the firing furnace used in the present invention, and FIg. 3B illustrates the magnetic fields produced by the electric current flowing through the coils installed on the outside of the insulation wall of the firing furnace.

A firing furnace 6 has a through passage. Coils 4 are wound on the outside of the insulation wall inside wall of the firing furnace 6 without leaving any vacant area in order to produce an induction magnetic field. Further, a heat protection wall 5 is installed rendering the subject firing furnace capable of providing a magnetic field of parallel magnetic fluxes through which the dielectric substrate is to pass, the magnetic field being produced by the electric current flowing through the coils 4.

The operation of the above-described firing furnace will now be described, i. e., the process through which the metal conduction components of the conductor printed on the dielectic substrate 1 are arranged into a uniform state.

First, a metal-containing conductor, i. e., a metal paste, is printed on the dielectric substrate to form an electrode, and then, this substrate is passed through the firing furnace resulting in the metal conduction components being arranged in a uniform manner as shown in FIG. 4.

That is, if an electric current is passed through the coils 4 of the firing furnace during the passing of the dielectric substrate through the firing furnace, then a uniform induction magnetic field is established as shown in FIg. 3B, and the conduction domains which have been distributed in a non-uniform manner are arranged into a uniform style.

Thus, because the metal components of the paste printed on the dielectric substrate are arranged, the resistance value of the conductor is reduced relative to a non-uniform arrangement.

In contrast to the method of the present invention, there is a method using a permanent magnet. However, this method has the disadvantages that a thermal agitation is generated, and a non-uniform magnetic field is produced, thereby making it impossible to obtain the effect produced by the subject method.

Thus, according to the present invention, the metal components of the paste are arranged into a uniform state by the induction magnetic field. Therefore, the resistance value of the metal components of the conductor is lowered, preventing power loss of a gas discharge display device due to a high resistance value. The process can be reliably carried out because the metal components of the paste are forcibly arranged into a uniform state.

It will be appreciated that the present invention is not restricted to any particular embodiment described hereinabove, and that variations and modifications may be made without departing from the spirit and scope of the invention as defined in the appended claims and equivalents thereof.

What is claimed is:

1. A method of forming a conductor pattern on a dielectric substrate having thereon a stripe pattern of a metal paste conductor composed of metal conduction components, which comprises:
    (a) sending an electric current through inductance coils wound on the outside of an insulation wall of a firing furnace to produce an induction magnetic field; and
    (b) arranging the metal conduction components by means of a magnetic force produced by the induction magnetic field.

* * * * *